US011145439B2

(12) United States Patent
Chen et al.

(10) Patent No.: US 11,145,439 B2
(45) Date of Patent: Oct. 12, 2021

(54) DISPLAY DEVICE, AND INSERTION AND PLUGGING PROTECTION DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Yifu Chen, Beijing (CN); Ting Dong, Beijing (CN); Yingying Qu, Beijing (CN); Yinlong Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 189 days.

(21) Appl. No.: 16/452,778

(22) Filed: Jun. 26, 2019

(65) Prior Publication Data
US 2020/0005964 A1 Jan. 2, 2020

(30) Foreign Application Priority Data
Jul. 2, 2018 (CN) .......................... 201810709635.7

(51) Int. Cl.
H01B 9/02 (2006.01)
H01B 7/08 (2006.01)
H05K 1/02 (2006.01)

(52) U.S. Cl.
CPC .............. *H01B 9/02* (2013.01); *H01B 7/0892* (2013.01); *H05K 1/028* (2013.01)

(58) Field of Classification Search
CPC ........ H01B 9/02; H01B 7/0892; H05K 1/028; G01R 31/67; H02H 9/004
See application file for complete search history.

(56) References Cited

U.S. PATENT DOCUMENTS 4,968,929 A * 11/1990 Hauck .................... G01R 31/67
324/66
7,088,050 B2 * 8/2006 Ishibashi ............. G02F 1/13452
315/169.1

(Continued)

FOREIGN PATENT DOCUMENTS

| CN | 203909793 U | 10/2014 |
| CN | 206282265 U | 6/2017 |
| CN | 107317316 A | 11/2017 |

OTHER PUBLICATIONS

First Office Action for Chinese Application No. 201810709635.7, dated Apr. 12, 2019, 7 Pages.

(Continued)

*Primary Examiner* — Scott Bauer
(74) *Attorney, Agent, or Firm* — Brooks Kushman P.C.

(57) ABSTRACT

An insertion and plugging protection device includes: at least one first interface assembly; at least one second interface assembly; at least one connector, a first end of each connector being adapted to a corresponding first interface assembly, and a second end of each connector being adapted to a corresponding second interface assembly; a protection circuit forming a protection loop, the protection loop being configured to generate a preset electric signal when the first end of each connector is connected to the corresponding first interface assembly and the second end of each connector is connected to the corresponding second interface assembly; and a power source control circuit connected to the protection circuit and a power source module of the display device, and configured to control the power source module to output a first preset power source voltage signal in accordance with the preset electric signal.

15 Claims, 8 Drawing Sheets

(56) References Cited

U.S. PATENT DOCUMENTS

| | | | | |
|---|---|---|---|---|
| 7,525,281 | B2* | 4/2009 | Koyanagi | B25J 19/005 |
| | | | | 320/107 |
| 7,898,295 | B1 | 3/2011 | Kasturirangan et al. | |
| 8,891,216 | B2* | 11/2014 | Mullins | H01R 13/665 |
| | | | | 361/58 |
| 9,166,345 | B2* | 10/2015 | Mullins | G06F 13/382 |
| 2011/0081154 | A1* | 4/2011 | Ueda | G03G 15/80 |
| | | | | 399/13 |
| 2011/0122663 | A1* | 5/2011 | Huang | H02H 9/004 |
| | | | | 363/50 |
| 2017/0273202 | A1* | 9/2017 | Joo | H01R 24/28 |

OTHER PUBLICATIONS

1st Chinese Office Action, English Translation.
CN107317316A, English Abstract and Machine Translation.
CN203909793U, English Abstract and Machine Translation.
CN206282265U, English Abstract and Machine Translation.

* cited by examiner

DISPLAY DEVICE, AND INSERTION AND PLUGGING PROTECTION DEVICE

CROSS-REFERENCE TO RELATED APPLICATION

This application claims priority to Chinese Patent Application No. 201810709635.7 filed on Jul. 2, 2018, which is incorporated herein by reference in its entirety.

TECHNICAL FIELD

The present disclosure relates to the field of display technology, in particular to an insertion and plugging protection device and a display device having the insertion and plugging protection device.

BACKGROUND

As a bridge connecting a display panel and a timing controller T-Con, a flexible flat cable (FFC) is indispensable. In the related art, during the manufacture of the display panel, it is necessary to perform a large quantity of FFC insertion and plugging operations for circuit detection. However, when the FFC is inserted or plugged in a power-off state, a takt time for switching on and off a power source may easily be omitted. When the FFC is inserted or plugged in a power-on state, usually a pin connection disorder and a short circuit may occur. At this time, an irreversible damage may occur for the display panel, and it is impossible to lighten the display panel, i.e., the yield of the display panel may be adversely affected to some extent.

SUMMARY

In one aspect, the present disclosure provides in some embodiments an insertion and plugging protection device for a display device, including: at least one first interface assembly arranged on a first substrate; at least one second interface assembly arranged on at least one second substrate; at least one connector, a first end of each connector being adapted to a corresponding first interface assembly, and a second end of each connector being adapted to a corresponding second interface assembly; a protection circuit forming a protection loop through the at least one first interface assembly, the at least one second interface assembly and the at least one connector, the protection loop being configured to generate a preset electric signal when the first end of each connector is connected to the corresponding first interface assembly and the second end of each connector is connected to the corresponding second interface assembly; and a power source control circuit connected to the protection circuit and a power source module of the display device, and configured to control the power source module to output a first preset power source voltage signal in accordance with the preset electric signal.

According to the insertion and plugging protection device for the display device in the embodiments of the present disclosure, the protection circuit forms the protection loop through the at least one first interface assembly, the at least one second interface assembly and the at least one connector, and the protection circuit is configured to generate the preset electric signal when the first end of each connector is connected to the corresponding first interface assembly and the second end of each connector is connected to the corresponding second interface assembly. The power source control circuit is configured to control the power source module to output the first preset power source voltage signal in accordance with the preset electric signal.

In a possible embodiment of the present disclosure, the protection circuit includes at least one protection sub-circuit each including a first protection section arranged at the corresponding first interface assembly, a second protection section arranged at the corresponding connector, and a third protection section arranged at the corresponding second interface assembly. The first protection section is adapted to the second protection section and electrically connected to the second protection section, and the second protection section is adapted to the third protection section and electrically connected to the third protection section.

In a possible embodiment of the present disclosure, the at least one protection sub-circuit is connected in series to each other, one end of the at least one protection sub-circuits connected in series to each other is connected to a second preset power source voltage signal line, and the other end is connected to the power source control circuit.

In a possible embodiment of the present disclosure, the first protection section includes a first lead pair, one end of one lead of the first lead pair is connected to a second preset power source voltage signal line or a first protection section of a previous protection sub-circuit, and one end of the other lead of the first lead pair is connected to a first protection section of a next protection sub-circuit or the power source control circuit. The second protection section includes a second lead pair, one end of one lead of the second lead pair is connected to the other end of the one lead of the first lead pair, and one end of the other lead of the second lead pair is connected to the other end of the other lead of the first lead pair. The third protection section includes a third lead pair, one end of one lead of the third lead pair is connected to the other end of the one lead of the second lead pair, one end of the other lead of the third lead pair is connected to the other end of the other lead of the second lead pair, and the other end of the one lead of the third lead pair is connected to the other end of the other lead of the third lead pair.

In a possible embodiment of the present disclosure, one end of one lead of a first lead pair of a first protection sub-circuit in the at least one protection sub-circuit serves as one end of the at least one protection sub-circuit connected in series to each other and is connected to the second preset power source voltage signal line. One end of one lead of a first lead pair of each protection sub-circuit in the at least one protection sub-circuit other than the first protection sub-circuit is connected to one end of the other lead of the first lead pair of the previous protection sub-circuit. One end of the other lead of a first lead pair of a last protection sub-circuit serves as the other end of the at least one protection sub-circuit connected in series to each other and is connected to the power source control circuit. One end of the other lead of the first lead pair of each protection sub-circuit in the at least one protection sub-circuit other than the last protection sub-circuit is connected to one end of one lead of a first lead pair of the next protection sub-circuit.

In a possible embodiment of the present disclosure, each protection sub-circuit further includes a processing sub-circuit connected between the other end of the one lead of the third lead pair and the other end of the other lead of the third lead pair, and configured to process an electric signal from the one lead of the third lead pair and output the processed electric signal via the other lead of the third lead pair, the other lead of the second lead pair and the other lead of the first lead pair.

In a possible embodiment of the present disclosure, the processing sub-circuit includes: a linear voltage regulator having a first pin, a second pin and a third pin, the first pin being connected to the other end of the one lead of the third lead pair via a first resistor, the third pin being connected to the other end of the other lead of the third lead pair; a second resistor, one end of which is connected to the third pin; and a third resistor, one end of which is connected to the other end of the second resistor, and the other end of which is grounded. The one end of the third resistor and the other end of the second resistor are connected to the second pin.

In a possible embodiment of the present disclosure, the processing sub-circuit further includes a first capacitor and a second capacitor connected in parallel to each other, one end of the first capacitor and the second capacitor connected in parallel to each other is connected to the first pin, and the other end of the first capacitor and the second capacitor connected in parallel to each other is grounded.

In a possible embodiment of the present disclosure, the processing sub-circuit further includes a third capacitor, a fourth capacitor and a voltage regulator transistor. One end of the third capacitor is connected to the second pin, and the other end of the third capacitor is grounded. One end of the fourth capacitor is connected to the third pin, and the other end of the fourth capacitor is grounded. A cathode of the voltage regulator transistor is connected to the third pin, and an anode of the voltage regulator transistor is grounded.

In a possible embodiment of the present disclosure, the power source control circuit includes: a fourth resistor, one end of which is connected to the second preset power source voltage signal line; a fifth resistor, one end of which is connected to the other end of the fourth resistor, and the other end of which is grounded; and a switching transistor, a control end of which is connected to the other end of the at least one protection sub-circuit connected in series to each other, a first end of which is connected to the one end of the fifth resistor and the other end of the fourth resistor, and a second end of which is connected to an Enable end of the power source module.

In a possible embodiment of the present disclosure, one end of the at least one protection sub-circuit is connected to at least one preset power source, and the other end of the at least one protection sub-circuit is connected to at least one input end of the power source control circuit.

In a possible embodiment of the present disclosure, each protection sub-circuit further includes a processing sub-circuit connected between the other end of the one lead of the third lead pair and the other end of the other lead of the third lead pair, and configured to process an electric signal from the one lead of the third lead pair and output the processed electric signal through the other lead of the third lead pair, the other lead of the second lead pair and the other lead of the first lead pair.

In a possible embodiment of the present disclosure, the at least one preset power source is connected to the protection loop, the processing sub-circuit of the at least one protection sub-circuit of the protection loop is configured to output at least one preset electric signal to the power source control circuit, and the power source control circuit is configured to control the power source module in accordance with the at least one preset electric signal so as to output a first preset power source voltage signal.

In a possible embodiment of the present disclosure, the power source control circuit includes a sixth resistor, a seventh resistor and at last one second switching transistor. One end of the sixth resistor is connected to the second preset power source voltage signal line. One end of the seventh resistor is connected to the other end of the sixth resistor, and the other end of the seventh resistor is grounded. A control end of the at least one second switching transistor is connected to the other end of the at least one protection sub-circuit. The second switching transistors are connected in series to each other, one end of the second switching transistors connected in series to each other is connected to the one end of the seventh resistor and the other end of the sixth resistor, and the other end of the second switching transistors connected in series to each other is connected to the Enable end of the power source module.

In a possible embodiment of the present disclosure, the connector is an FFC.

In another aspect, the present disclosure provides in some embodiments a display device including the above-mentioned insertion and plugging protection device.

DETAILED DESCRIPTION

Figure 1:
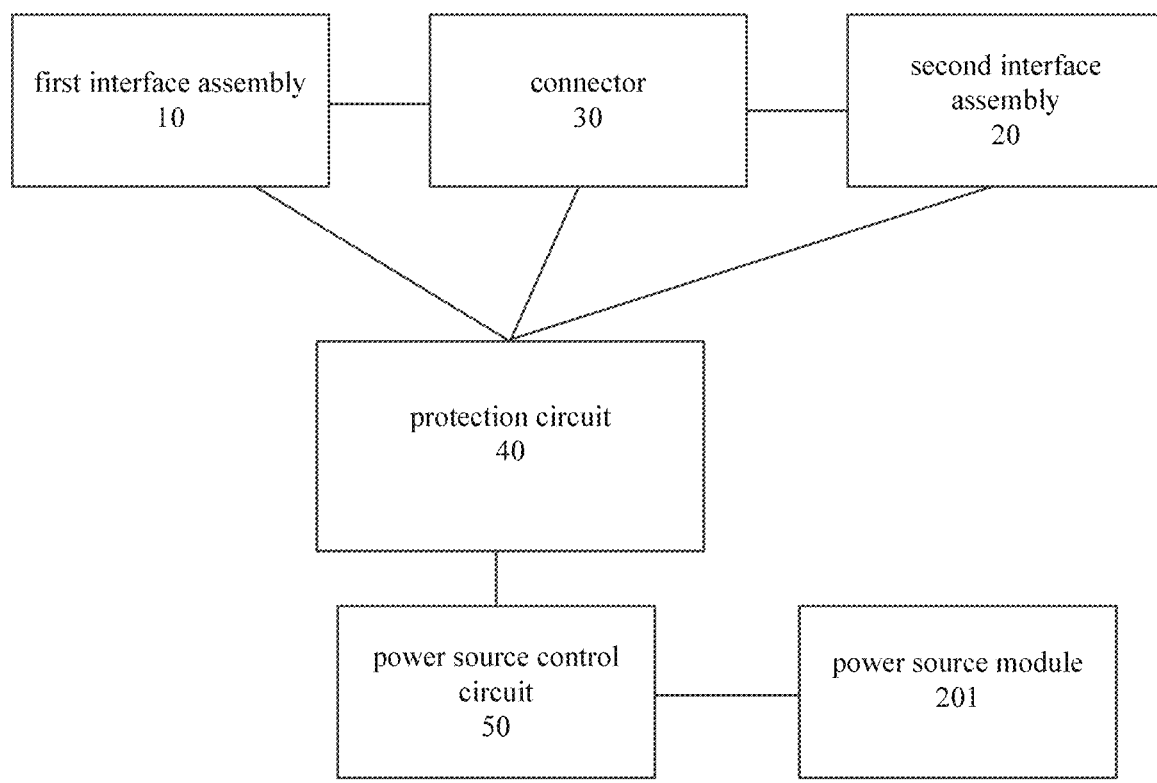
FIG. 1 is a block schematic view showing an insertion and plugging protection device for a display device according to one embodiment of the present disclosure.

The present disclosure will be described hereinafter in conjunction with the embodiments and the drawings. Identical or similar reference numbers in the drawings represent an identical or similar element or elements having an identical or similar function. The following embodiments are for illustrative purposes only, but shall not be used to limit the scope of the present disclosure.

A display device and an insertion and plugging protection device will be described hereinafter in conjunction with the drawings.

Figure 2:
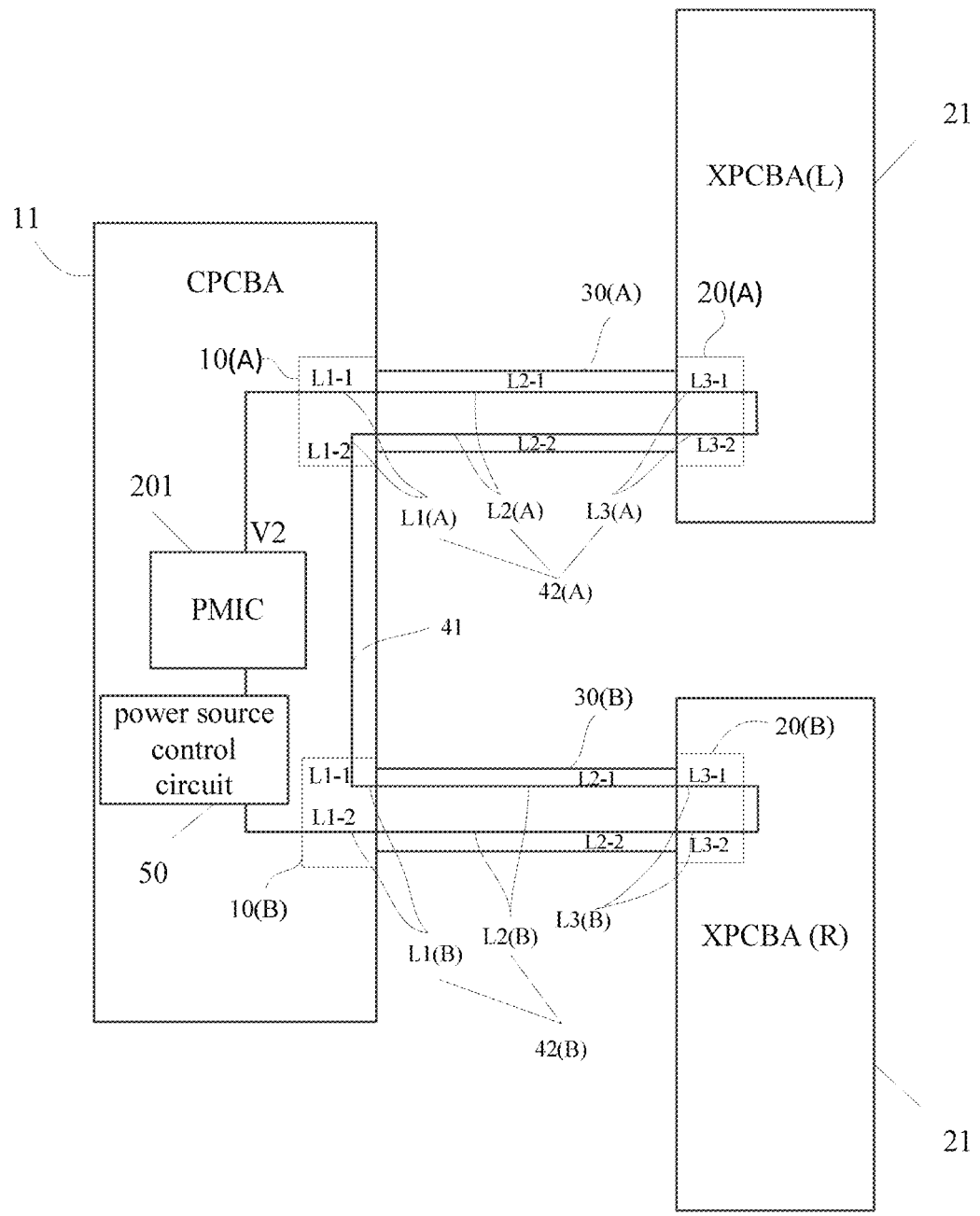
FIG. 2 is a structural schematic view showing the insertion and plugging protection device without a processing sub-circuit according to one embodiment of the present disclosure.
Figure 3:
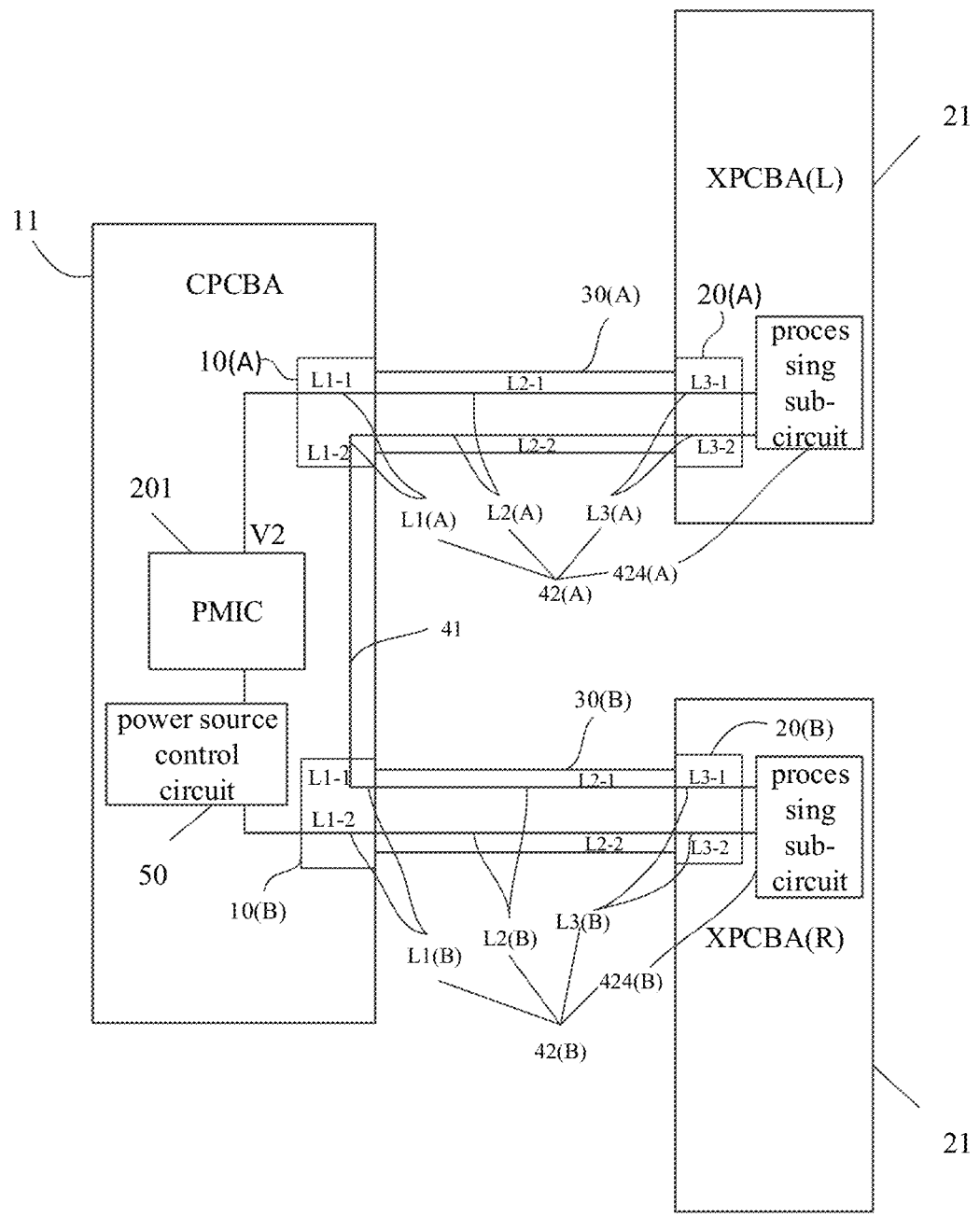
FIG. 3 is another structural schematic view showing the insertion and plugging protection device with the processing sub-circuit according to one embodiment of the present disclosure.

The present disclosure provides in some embodiments an insertion and plugging protection device for a display device. As shown in FIGS. 1-3, the insertion and plugging protection device includes at least one first interface assembly 10, at least one second interface assembly 20, at least one connector 30, a protection circuit 40 and a power source control circuit 50.

The at least one first interface assembly 10 may be arranged on a first substrate 11. The at least one second interface assembly 20 may be arranged on at least one second substrate 21. A first end of each connector 30 may be adapted to a corresponding first interface assembly 10, and a second end of each connector 30 may be adapted to a corresponding second interface assembly 20. The protection circuit 40 may form a protection loop 41 through the at least one first interface assembly 10, the at least one second interface assembly 20 and the at least one connector 30. The protection circuit 41 is configured to generate a preset electric signal when the first end of each connector 30 is connected to the corresponding first interface assembly 10 and the second end of each connector 30 is connected to the corresponding second interface assembly 20. The power source control circuit 50 may be connected to the protection circuit 40 and a power source module 201 of the display device, and configured to control the power source module 201 to output a first preset power source voltage signal V1 in accordance with the preset electric signal.

It should be appreciated that, the protection circuit 40 may be integrated into the first substrate 11 and the second substrate 21, or serve as a separate circuit.

To be specific, when the first end of each connector 30 is connected to the corresponding first interface assembly 10 and the second end of each connector 30 is connected to the corresponding second interface assembly 20, the protection loop 41 may form an electrical path, so as to output the preset electric signal to the power source control circuit 50. At this time, the power source control circuit 50 may control the power source module 201 to be powered on, so as to supply power to the other elements. An electric signal may be transmitted via a data transmission line of the connector 30, so it is able to achieve a display function.

More specifically, the connector 30 may be an FFC. The first substrate 11 may be a CPCBA circuit board, particularly a T-Con board. The second substrate 21 may be an XPCBA circuit board. For example, the at least one second substrate 21 may include an XPCBA(L) circuit board and an XPCBA (R) circuit board, and the XPCBA circuit boards maybe connected to a display panel. The power source module 201 may be a main power source on the T-Con board, and the power source control circuit 50 may be arranged on the first substrate 11. Hence, when the power source control circuit 50 is arranged on the T-Con board and the FFC is connected to both the first interface assembly 10 and the second interface assembly 20, the protection loop 41 may generate the preset electric signal and output the preset electric signal to the power source control circuit 50. Then, the power source control circuit 50 may control the main power source on the T-Con board to be powered on, so as to supply power to the other elements. Here, PCBA is short for Printed Circuit Board+Assembly, i.e., an entire process of subjecting a bare PCB to surface mount technology (SMT) and dual inline-pin package (DIP) is called as PCBA.

According to the insertion and plugging protection device for the display device in the embodiments of the present disclosure, it is able to prevent the occurrence of a pin connection disorder and a short circuit caused when the connector is inserted and plugged in a hot-line manner, and prevent the occurrence of an irreversible image abnormality for the display device (e.g., the display panel or T-Con) or prevent the display device from being burned out, thereby to improve the yield. In addition, it is able to facilitate the insertion and plugging of the FFC in a hot-line manner during the detection of the display panel, thereby to improve the production efficiency.

As shown in FIGS. 2-5, the protection circuit 40 may include at least one protection sub-circuit 42. Each protection sub-circuit 42 may include a first protection section arranged at the corresponding first interface assembly 10, a second protection section arranged at the corresponding connector 30, and a third protection section arranged at the corresponding second interface assembly 20. The first protection section may be adapted to the second protection section so as to be electrically connected to the second protection section, and the second protection section may be adapted to the third protection section so as to be electrically connected to the third protection section.

In other words, when the connector 30 is connected to the first interface assembly 10 and the second interface assembly 20, the first protection section may be lapped onto the second protection section, and the second protection section may be lapped onto the third protection section, so as to form the protection loop 41.

First Embodiment

As shown in FIGS. 2-3, the at least one protection sub-circuit 42 may be connected in series to each other. One end of the at least one protection sub-circuit 42 connected in series to each other may be connected to a second preset power source voltage signal (V2) line of the power source module, and the other end of the at least one protection sub-circuit 42 connected in series to each other may be connected to the power source control circuit 50.

To be specific, as shown in FIGS. 2-3, the first protection section may include a first lead pair L1, one end of one lead L1-1 of the first lead pair L1 may be connected to the second preset power source voltage signal (V2) line or a first protection section of a previous protection sub-circuit, and one end of the other lead L1-2 of the first lead pair L1 may be connected to a first protection section of a next protection sub-circuit or the power source control circuit 50. The second protection section may include a second lead pair L2, one end of one lead L2-1 of the second lead pair L2 may be connected to the other end of the one lead L1-1 of the first lead pair L1, and one end of the other lead L2-2 of the second lead pair L2 may be connected to the other end of the other lead L1-2 of the first lead pair L1. The third protection section may include a third lead pair L3, one end of one lead L3-1 of the third lead pair L3 may be connected to the other end of the one lead L2-1 of the second lead pair L2, one end of the other lead L3-2 of the third lead pair L3 may be connected to the other end of the other lead L2-2 of the second lead pair L2, and the other end of the one lead L3-1 of the third lead pair L3 may be connected to the other end of the other lead L3-2 of the third lead pair L3.

It should be appreciated that, one end of one lead L1-1 of a first lead pair L1 of a first protection sub-circuit in the at least one protection sub-circuit 42 may serve as one end of the at least one protection sub-circuit 42 connected in series to each other and may be connected to the second preset power source voltage signal V2 line. One end of one lead L1-1 of a first lead pair L1 of each protection sub-circuit in the at least one protection sub-circuit 42 other than the first protection sub-circuit may be connected to one end of the other lead of the first lead pair of the previous protection sub-circuit. In addition, one end of the other lead L1-2 of a first lead pair L1 of a last protection sub-circuit may serve as the other end of the at least one protection sub-circuit 42 connected in series to each other and may be connected to the power source control circuit 50. One end of the other lead L1-2 of the first lead pair L1 of each protection sub-circuit in the at least one protection sub-circuit 42 other than the last protection sub-circuit may be connected to one end of one lead of a first lead pair of the next protection sub-circuit.

In other words, when the connector 30 is connected to the first interface assembly 10 and the second interface assembly 20, the one lead L1-1 of the first lead pair L1 may be lapped onto the one lead L2-1 of the second lead pair L2, the one lead L2-1 of the second lead pair L2 may be lapped onto the one lead L3-1 of the third lead pair L3, the other lead L3-2 of the third lead pair L3 may be lapped onto the other lead L2-2 of the second lead pair L2, and the other lead L2-2 of the second lead pair L2 may be lapped onto the other lead L1-2 of the first lead pair L1. In this way, the first lead pair L1, the second lead pair L2 and the third lead pair L3 of each protection sub-circuit 42 may form a sub-loop. In addition, apart from the first protection sub-circuit, the one lead L1-1 of the first lead pair L1 of each protection sub-circuit may be connected to the other lead of the first lead pair of the previous protection sub-circuit, so the at least one protection sub-circuit 42 may form the on-state protection loop 41 when the sub-loops each formed by the first lead pair L1, the second lead pair L2 and the third lead pair L3 are connected in series to each other.

A second preset power source signal V2 may be applied to the protection loop 41. The protection loop 41 may output the preset electric signal to the power source control circuit 50 in accordance with the second preset power source voltage signal V2. For example, the second preset power source voltage signal V2 may be applied to the power source control circuit 50 via the protection loop 41, and then the power source control circuit 50 may enable the power source module 201 so as to output the first preset power source voltage signal V1.

It should be appreciated that, a signal outputted from the other end of the at least one protection sub-circuit 42 connected in series to each other may be just the preset electric signal. In other words, the signal from the one end of the other lead L1-2 of the first lead pair L1 of the last protection sub-circuit 42 may be just the preset electric signal.

As shown in FIG. 3, each protection sub-circuit 42 may further include a processing sub-circuit 424 connected between the other end of the one lead L3-1 of the third lead pair L3 and the other end of the other lead L3-2 of the third lead pair L3, and configured to process an electric signal from the one lead L3-1 of the third lead pair L3 and output the processed electric signal via the other lead L3-2 of the third lead pair L3, the other lead L2-2 of the second lead pair L2 and the other lead L1-2 of the first lead pair L1.

In other words, the other end of the one lead L3-1 of the third lead pair L3 may be connected to the other end of the other lead L3-2 of the third lead pair L3 via the processing sub-circuit 424. Hence, the second preset power source voltage signal V2 or an electric signal from the previous protection sub-circuit 42 may be applied to the processing sub-circuit 424 via the one lead L1-1 of the first lead pair L1 and the one lead L2-1 of the second lead pair L2. The processing sub-circuit 424 may process the received electric signal, e.g., perform voltage conversion on the received electric signal, and output the processed electric signal through the other lead L3-2 of the third lead pair L3, the other lead L2-2 of the second lead pair L2 and the other lead L1-2 of the first lead pair L1.

Hence, the second preset power source voltage signal V2 may be applied to the protection loop 41, the processing sub-circuit 424 of the at last one protection sub-circuit 42 of the protection loop 41 may output the preset electric signal to the power source control circuit 50, and then the power source control circuit 50 may control the power source module 201 to be powered on so as to output the first preset power source voltage signal V1.

Figure 6:
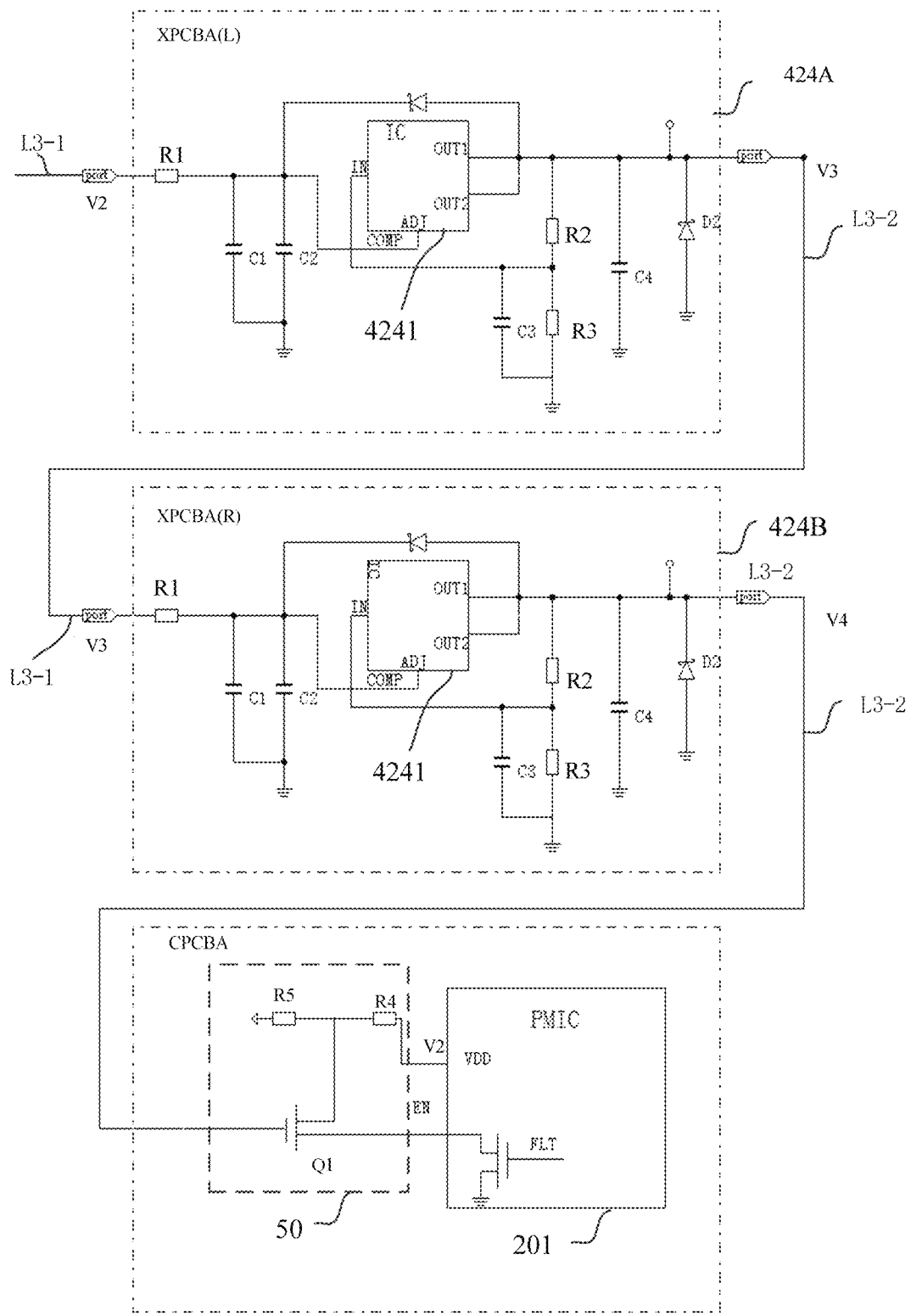
FIG. 6 is a circuit diagram of the insertion and plugging protection device according to one embodiment of the present disclosure.

To be specific, as shown in FIG. 6, the processing sub-circuit 424 may include a linear voltage regulator 4241, a second resistor R2 and a third resistor R3.

The linear voltage regulator 4241 may have a first pin ADJ, a second pin IN and a third pin OUT1. The first pin ADJ may be connected to the other end of the one lead L3-1 of the third lead pair L3 via a first resistor R1. The third pin OUT1 may be connected to the other end of the other lead L3-2 of the third lead pair L3. One end of the second resistor R2 may be connected to the third pin OUT1. One end of the third resistor R3 may be connected to the other end of the second resistor R2, and the other end of the third resistor R3 may be grounded. The one end of the third resistor R3 and the other end of the second resistor R2 may be connected to the second pin IN. The linear voltage regulator 4241 may further have a fourth pin OUT2 connected to the third pin OUT1.

As shown in FIG. 6, the processing sub-circuit 424 may further include a first capacitor C1 and a second capacitor C2 connected in parallel to each other. One end of the first capacitor C1 and the second capacitor C2 connected in parallel to each other may be connected to the first pin ADJ, and the other end of the first capacitor C1 and the second capacitor C2 connected in parallel to each other may be grounded.

The processing sub-circuit 424 may further include a third capacitor C3, a fourth capacitor C4 and a voltage regulator diode D2. One end of the third capacitor C3 may be connected to the second pin IN, and the other end of the third capacitor C3 may be grounded. One end of the fourth capacitor C4 may be connected to the third pin OUT1, and the other end of the fourth capacitor C4 may be grounded. A cathode of the voltage regulator diode D2 may be connected to the third pin OUT1, and an anode of the voltage regulator diode D2 may be grounded.

It should be appreciated that, the processing sub-circuit 424 may convert a voltage of the electric signal received by the first pin ADJ in accordance with a preset conversion ratio, and output the converted voltage via the third pin OUT1.

Further, as shown in FIG. 6, the power source control circuit 50 may include a fourth resistor R4, a fifth resistor R5 and a switching transistor Q1.

One end of the fourth resistor R4 may be connected to the second preset power source voltage signal (V2) line. One end of the fifth resistor R5 may be connected to the other end of the fourth resistor R4, and the other end of the fifth resistor R5 may be grounded. A control end of the switching transistor Q1 may be connected to the other end of the at least one protection sub-circuit 42 connected in series to each other, i.e., connected to the one end of the other lead L1-2 of the first lead pair L1 of the last protection sub-circuit, a first end of the switching transistor Q1 may be connected to the one end of the fifth resistor R5 and the other end of the fourth resistor R4, and a second end of the switching transistor Q1 may be connected to an Enable end EN of the power source module 201.

To be specific, a preset voltage signal may be applied to the control end of the switching transistor Q1. Under the control of the preset voltage signal, the switching transistor Q1 may be turned on. A voltage acquired after the second preset power source voltage signal V2 is divided by the fourth resistor R4 and the fifth resistor R5 may be applied to the Enable end EN of the power source module 201 via the switching transistor Q1, so as to turn on the power source module 201 and output the first preset power source voltage signal V1.

The insertion and plugging device will be described hereinafter in more details when there are two first interface assemblies 10, two connectors 30 and two second interface assemblies 20.

As shown in FIGS. 2-3 and 6, the two first interface assemblies 10 may include a first interface assembly 10A and a first interface assembly 10B, the two connectors 30 may include a first connector 30A and a second connector 30B, and the two second interface assemblies 20 may include a second interface assembly 20A and a second interface assembly 20B. The protection circuit 40 may include two protection sub-circuits 42. A first protection sub-circuit 42A of the two protection sub-circuits 42 may include a first lead pair L1A arranged at the first interface assembly 10A, a second lead pair L2A arranged at the first connector 30A, a third lead pair L3A arranged at the second interface assembly 20A, and a first processing sub-circuit 424A. A second protection sub-circuit 42B of the two protection sub-circuits 42 may include a first lead pair L1B arranged at the first interface assembly 10B, a second lead pair L2B arranged at the second connector 30B, a third lead pair L3B arranged at the second interface assembly 20B, and a second processing sub-circuit 424B.

To be specific, one end of one lead L1-1 of the first lead pair L1A may be connected to the second preset power source voltage signal (V2) line, the other end of the one lead L1-1 of the first lead pair L1A may be connected to one end of one lead L2-1 of the second lead pair L2A, the other end of the one lead L2-2 of the second lead pair L2A may be connected to one end of one lead L3-1 of the third lead pair L3A, the other end of the one lead L3-1 of the third lead pair L3A may be connected to a first pin ADJ of a linear voltage regulator 4241 of the first processing sub-circuit 424A, a third pin OUT1 of the linear voltage regulator 4241 of the first processing sub-circuit 424A may be connected to the other end of the other lead L3-2 of the third lead pair L3A, one end of the other lead L3-2 of the third lead pair L3A may be connected to the other end of the other lead L2-2 of the second lead pair L2A, and one end of the other lead L2-2 of the second lead pair L2A may be connected to the other end of the other lead L1-2 of the first lead pair L1A.

One end of one lead L1-1 of the first lead pair L1B may be connected to the one end of the other lead L1-2 of the first lead pair L1A, the other end of the one lead L1-1 of the first lead pair L1B may be connected to one end of one lead L2-1 of the second lead pair L2B, the other end of the one lead L2-2 of the second lead pair L2B may be connected to one end of one lead L3-1 of the third lead pair L3B, the other end of the one lead L3-1 of the third lead pair L3B may be connected to a first pin ADJ of a linear voltage regulator 4241 of the second processing sub-circuit 424B, a third pin OUT1 of the linear voltage regulator 4241 of the second processing sub-circuit 424B may be connected to the other end of the other lead L3-2 of the third lead pair L3B, one end of the other lead L3-2 of the third lead pair L3B may be connected to the other end of the other lead L2-2 of the second lead pair L2B, one end of the other lead L2-2 of the second lead pair L2B may be connected to the other end of the other lead L1-2 of the first lead pair L1B, and one end of the other lead L1-2 of the first lead pair L1B may be connected to the power source control circuit 50.

Hence, the second preset power source voltage signal V2, e.g., 5V, may be applied to the linear voltage regulator 4241 of the first processing sub-circuit 424A via the one lead L1-1 of the first lead pair L1A, the one lead L2-1 of the second lead pair L2A and the one lead L3-1 of the third lead pair L3A. Then, the linear voltage regulator 4241 of the first processing sub-circuit 424A may convert the second preset power source voltage signal V2 into a third preset power source voltage signal V3, e.g., 4V.

The third preset power source voltage signal V3 may be applied to the linear voltage regulator 4241 of the second processing sub-circuit 424A via the other lead L3-2 of the third lead pair L3A, the other lead L2-2 of the second lead pair L2A, the other lead L1-2 of the first lead pair L1A, the one lead L1-1 of the first lead pair L1B, the one lead L2-1 of the second lead pair L2B, and the one lead L3-1 of the third lead pair L3B. Then, the linear voltage regulator 4241 of the second processing sub-circuit 424A may convert the third preset power source voltage signal V3 into a fourth preset power source voltage signal V4, e.g., 3.3V. The fourth preset power source voltage signal V4 may be applied to the power source control circuit 50, i.e., the control end of the switching transistor Q1, via the other lead L3-2 of the third lead pair L3B, the other lead L2-2 of the second lead pair L2B and the other lead L1-2 of the first lead pair L1B, so as to turn on the switching transistor Q1 and the power source module 201.

It should be appreciated that, the fourth preset power source voltage signal V4 may be just the preset electric signal.

As a result, it is able to prevent the occurrence of a PIN connection disorder and a short circuit caused when the connector is inserted and plugged in a hot-line manner, and prevent the occurrence of an irreversible image abnormality for the display device (e.g., the display panel or T-Con) or prevent the display device from being burned out, thereby to improve the yield. In addition, it is able to facilitate the insertion and plugging of the FFC in a hot-line manner during the detection of the display panel, thereby to improve the production efficiency.

Second Embodiment

Figure 4:
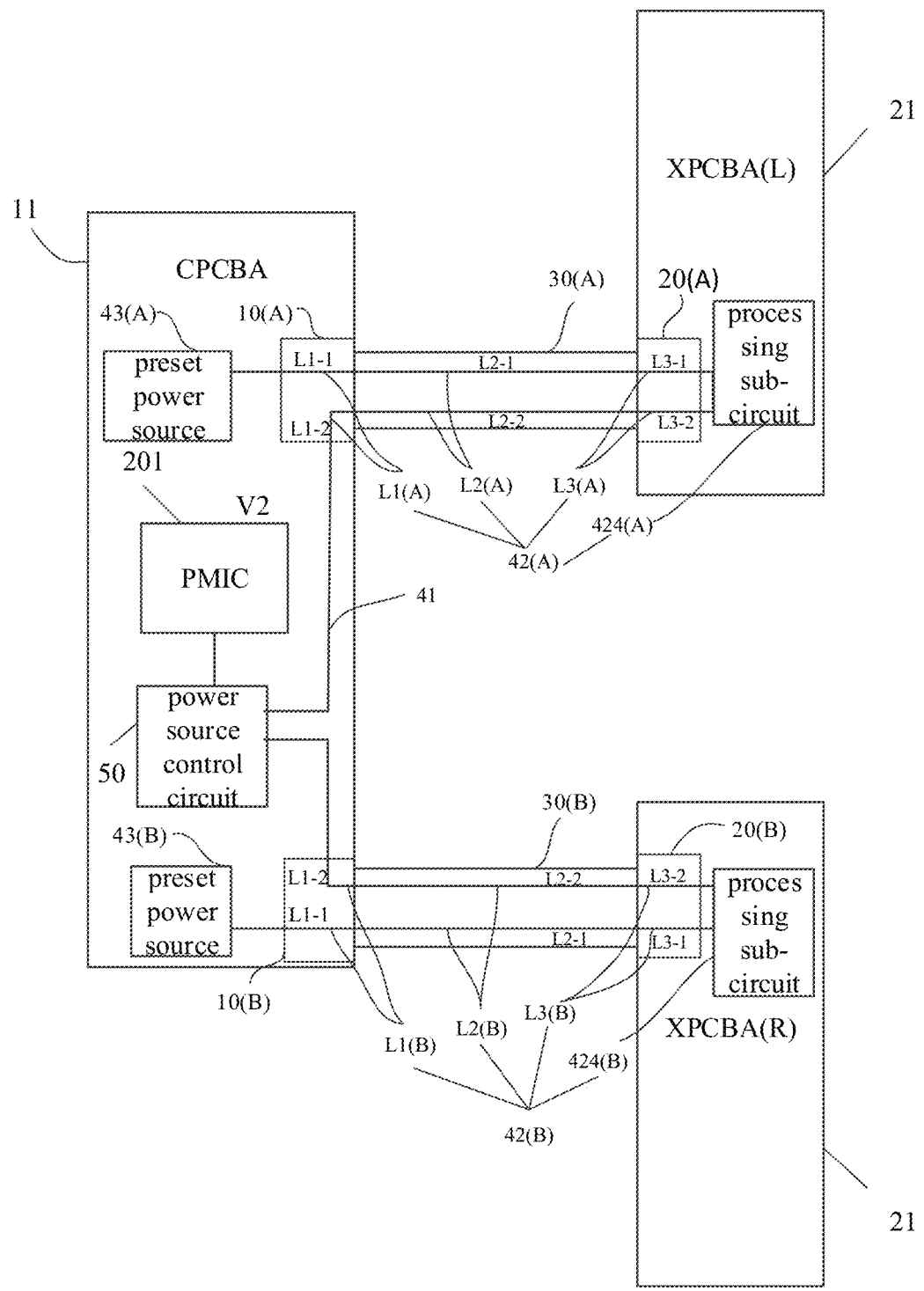
FIG. 4 is yet another structural schematic view showing the insertion and plugging protection device without the processing sub-circuit according to one embodiment of the present disclosure.
Figure 5:
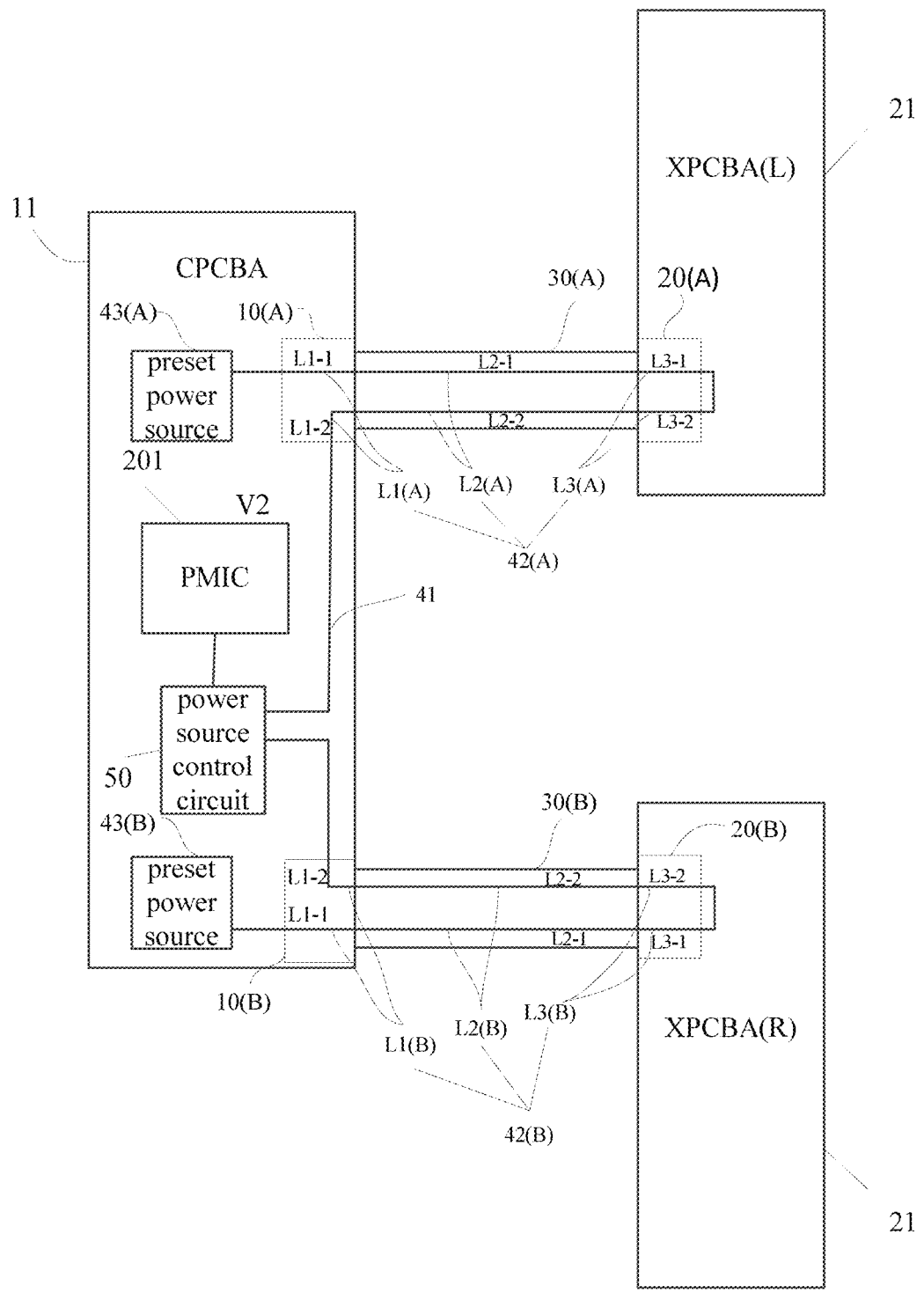
FIG. 5 is still yet another structural schematic view showing the insertion and plugging protection device with the processing sub-circuit according to one embodiment of the present disclosure.

As shown in FIGS. 4-5, one end of the at least one protection sub-circuit 42 may be connected to at least one preset power source 43, and the other end of the at least one protection sub-circuit 42 may be connected to at least one input end of the power source control circuit 50.

To be specific, as shown in FIGS. 4-5, the first protection section may include a first lead pair L1. One end of one lead L1-1 of the first lead pair L1 may be connected to a corresponding preset power source 43, and one end of the other lead L1-2 of the first lead pair L1 may be connected to a corresponding input end of the power source control circuit 50. The second protection section may include a second lead pair L2. One end of one lead L2-1 of the second lead pair L2 may be connected to the other end of the one lead L1-1 of the first lead pair L1, and one end of the other lead L2-2 of the second lead pair L2 may be connected to the other end of the other lead L1-2 of the first lead pair L. The third protection section may include a third lead pair L3. One end of one lead L3-1 of the third lead pair L3 may be connected to the other end of the one lead L2-1 of the second lead pair L2, one end of the other lead L3-2 of the third lead pair L3 may be connected to the other end of the other lead L2-2 of the second lead pair L2, and the other end of the one lead L3-1 of the third lead pair L3 may be connected to the other end of the other lead L3-2 of the third lead pair L3.

It should be appreciated that, the one end of the one lead L1-1 of the first lead pair L1 may serve as one end of the protection sub-circuit 2, and the one end of the other lead L1-2 of the first lead pair L1 may serve as the other end of the protection sub-circuit 42.

In other words, when the connector 30 is connected to the first interface assembly 10 and the second interface assembly 20, the one lead L1-1 of the first lead pair L1 may be lapped onto the one lead L2-1 of the second lead pair L2, the one lead L2-1 of the second lead pair L2 may be lapped onto the one lead L3-1 of the third lead pair L3, the other lead L3-2 of the third lead pair L3 may be lapped onto the other lead L2-2 of the second lead pair L2, and the other lead L2-2 of the second lead pair L2 may be lapped onto the other lead L1-2 of the first lead pair L1. In this way, the first lead pair L1, the second lead pair L2 and the third lead pair L3 of each protection sub-circuit 42 may form a corresponding sub-loop, and at least one sub-loop formed by the at least one protection sub-circuit 42 may form the protection loop 41.

At this time, there may exist at least one preset electric signal. The at least one preset power source 43 may be connected to the at least one sub-loop, and each sub-loop may output the corresponding preset electric signal to the power source control circuit 50 in accordance with the corresponding preset power source, e.g., each preset power source may be connected to the power source control circuit 50 via the corresponding sub-loop. Then, the power source control circuit 50 may control the power source module 201 to be turned on in accordance with the at least one preset electric signal, so as to output the first preset power source voltage signal V1.

It should be appreciated that, a signal outputted from each protection sub-circuit 42 may be just the preset electric signal. In other words, a signal outputted from the one end of the other lead L1-2 of the first lead pair L1 in each protection sub-circuit 42 may be just the preset electric signal.

As shown in FIG. 4, each protection sub-circuit 42 may further include a processing sub-circuit 424 connected between the other end of the one lead L3-1 of the third lead pair L3 and the other end of the other lead L3-2 of the third lead pair L3, and configured to process an electric signal from the one lead L3-1 of the third lead pair L3 and output the processed electric signal via the other lead L3-2 of the third lead pair L3, the other lead L2-2 of the second lead pair L2 and the other lead L1-2 of the first lead pair L1.

In other words, the other end of the one lead L3-1 of the third lead pair L3 may be connected to the other end of the other lead L3-2 of the third lead pair L3 via the processing sub-circuit 424. Hence, an electric signal from the corresponding preset power source 43 may be applied to the processing sub-circuit 424 via the one lead L1-1 of the first lead pair L1 and the one lead L2-1 of the second lead pair L2. The processing sub-circuit 424 may process the received electric signal, e.g., preform voltage conversion on the received electric signal, and output the processed electric signal to the corresponding input end of the power source control circuit 50 through the other lead L3-2 of the third lead pair L3, the other lead L2-2 of the second lead pair L2 and the other lead L1-2 of the first lead pair L1.

Hence, the at least one preset power source 43 may supply power to the protection loop 41. The processing sub-circuit 424 of the at least one protection sub-circuit 42 in the protection loop 41 may output at least one preset electric signal to the power source control circuit 50. Then, the power source control circuit 50 may control the power source module 201 to be powered on in accordance with the at least one preset electric signal, so as to output the first preset power source voltage signal V1.

It should be appreciated that, the structure and the operating principle of the processing sub-circuit 424 in the second embodiment are substantially the same as those of the processing sub-circuit 424 in the first embodiment, and thus will not be particularly defined herein.

Figure 7:
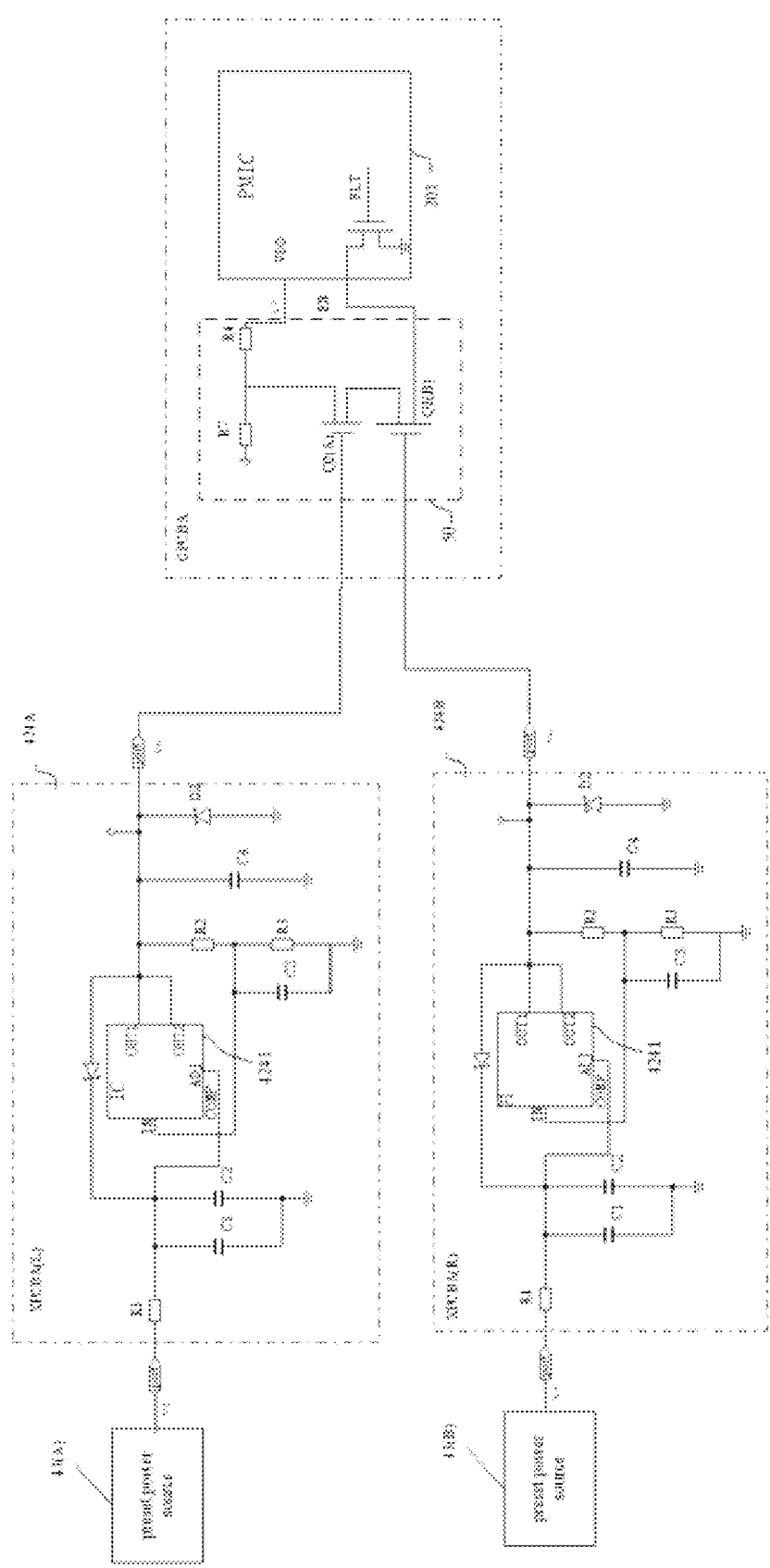
FIG. 7 is another circuit diagram of the insertion and plugging protection device according to one embodiment of the present disclosure.

Further, as shown in FIG. 7, the power source control circuit 50 may include a sixth resistor R6, a seventh resistor R7 and at least one second switching transistor Q2.

One end of the sixth resistor R6 may be connected to the second preset power source voltage signal (V2) line. One end of the seventh resistor R7 may be connected to the other end of the sixth resistor R6, and the other end of the seventh resistor R7 may be grounded. A control end of the at least one second switching transistor Q2 may be connected to the other end of the at least one protection sub-circuit 42, i.e., connected to the one end of the other lead L1-2 of the first lead pair L1 in the protection sub-circuit 42. The second switching transistors Q2 may be connected in series to each other, one end of the second switching transistors Q2 connected in series to each other may be connected to the one end of the seventh resistor R7 and the other end of the sixth resistor R6, and the other end of the second switching transistors Q2 connected in series to each other may be connected to the Enable end EN of the power source module 201.

To be specific, at least one preset voltage signal may be applied to the control end of the at least one second switching transistor Q2. Under the control of the preset voltage signal, each second switching transistor Q2 may be turned on. A voltage acquired after the second preset power source voltage signal V2 is divided by the sixth resistor R6 and the seventh resistor R7 may be applied to the Enable end EN of the power source module 201 via the at least one second switching transistor Q2, so as to turn on the power source module 201 and output the first preset power source voltage signal V1.

The insertion and plugging device will be described hereinafter in more details when there are two first interface assemblies 10, two connectors 30 and two second interface assemblies 20.

As shown in FIGS. 4-5 and 7, the two first interface assemblies 10 may include a first interface assembly 10A and a first interface assembly 10B, the two connectors 30 may include a first connector 30A and a second connector 30B, and the two second interface assemblies 20 may include a second interface assembly 20A and a second interface assembly 20B. The at least one preset power source 43 may include two preset power sources, i.e., a fifth preset power source 43A and a sixth preset power source 43B. The protection circuit 40 may include two protection sub-circuits 42. A first protection sub-circuit 42A of the two protection sub-circuits 42 may include a first lead pair L1A arranged at the first interface assembly 10A, a second lead pair L2A arranged at the first connector 30A, a third lead pair L3A arranged at the second interface assembly 20A, and a first processing sub-circuit 424A. A second protection sub-circuit 42B of the two protection sub-circuits 42 may include a first lead pair L1B arranged at the first interface assembly 10B, a second lead pair L2B arranged at the second connector 30B, a third lead pair L3B arranged at the second interface assembly 20B, and a second processing sub-circuit 424B.

In addition, the power source control circuit 50 may include two second switching transistors Q2. A control end of a second switching transistor Q2A of the two second switching transistors Q2 may be connected to the fifth preset power source 43A, a control end of a second switching transistor Q2B of the two second switching transistors Q2 may be connected to the sixth preset power source 43B, a first end of the second switching transistor Q2A may be connected to the one end of the seventh resistor R7 and the other end of the sixth resistor R6, a second end of the second switching transistor Q2A may be connected to a first end of the second switching transistor Q2B, and a second end of the second switching transistor Q2B may be connected to the Enable end EN of the power source module 201.

To be specific, the one end of the one lead L1-1 of the first lead pair L1A may be connected to the fifth preset power source 43A, the other end of the one lead L1-1 of the first lead pair L1A may be connected to the one end of the one lead L2-1 of the second lead pair L2A, the other end of the one lead L2-1 of the second lead pair L2A may be connected to the one end of the one lead L3-1 of the third lead pair L3A, the other end of the one lead L3-1 of the third lead pair L3A may be connected to a first pin ADJ of a linear voltage regulator 4241 of the first processing sub-circuit 424A, a third pin OUT1 of the linear voltage regulator 4241 of the first processing sub-circuit 424A may be connected to the other end of the other lead L3-2 of the third lead pair L3A, the one end of the other lead L3-2 of the third lead pair L3A may be connected to the other end of the other lead L2-2 of the second lead pair L2A, the one end of the other lead L2-2 of the second lead pair L2A may be connected to the other end of the other lead L1-2 of the first lead pair L1A, and the one end of the other lead L1-2 of the first lead pair L1A may be connected to the control end of the second switching transistor Q2A.

The one end of the one lead L1-1 of the first lead pair L1B may be connected to the sixth preset power source 43B, the other end of the one lead L1-1 of the first lead pair L1B may be connected to the one end of the one lead L2-1 of the second lead pair L2B, the other end of the one lead L2-1 of the second lead pair L2B may be connected to the one end of the one lead L3-1 of the third lead pair L3B, the other end of the one lead L3-1 of the third lead pair L3B may be connected to a first pin ADJ of a linear voltage regulator 4241 of the second processing sub-circuit 424B, a third pin OUT1 of the linear voltage regulator 4241 of the second processing sub-circuit 424B may be connected to the other end of the other lead L3-2 of the third lead pair L3B, the one end of the other lead L3-2 of the third lead pair L3B may be connected to the other end of the other lead L2-2 of the second lead pair L2B, the one end of the other lead L2-2 of the second lead pair L2B may be connected to the other end of the other lead L1-2 of the first lead pair L1B, and the one end of the other lead L1-2 of the first lead pair L1B may be connected to the control end of the second switching transistor Q2B.

Hence, a fifth preset power source voltage signal, e.g., 5V, may be applied to the linear voltage regulator 4241 of the first processing sub-circuit 424A via the one lead L1-1 of the first lead pair L1A, the one lead L2-1 of the second lead pair L2A and the one lead L3-1 of the third lead pair L3A. Then, the linear voltage regulator 4241 of the first processing sub-circuit 424A may convert the second preset power source voltage signal V2 into a sixth preset power source voltage signal, e.g., 3.3V. The sixth preset power source voltage signal may be applied to the control end of the second switching transistor Q2A via the other lead L3-2 of the third lead pair L3A, the other lead L2-2 of the second lead pair L2A and the other lead L1-2 of the first lead pair L1A, so as to turn on the second switching transistor Q2A.

The fifth preset power source voltage signal, e.g., 5V, may be applied to the linear voltage regulator 4241 of the second processing sub-circuit 424B via the one lead L1-1 of the first lead pair L1B, the one lead L2-1 of the second lead pair L2B and the one lead L3-1 of the third lead pair L3B. Then, the linear voltage regulator 4241 of the second processing sub-circuit 424B may convert the fifth preset power source voltage signal V5 into the sixth preset power source voltage signal, e.g., 3.3V. The sixth preset power source voltage signal may be applied to the control end of the second switching transistor Q2B via the other lead L3-2 of the third lead pair L3B, the other lead L2-2 of the second lead pair L2B and the other lead L1-2 of the first lead pair L1B.

When the second switching transistors Q2A and Q2B are both turned on, the power source module 201 may be enabled.

It should be appreciated that, the sixth preset power source voltage signal in this embodiment may be just the preset electric signal.

As a result, it is able to prevent the occurrence of a PIN connection disorder and a short circuit caused when the connector is inserted and plugged in a hot-line manner, and prevent the occurrence of an irreversible image abnormality for the display device (e.g., the display panel or T-Con) or prevent the display device from being burned out, thereby to improve the yield. In addition, it is able to facilitate the insertion and plugging of the FFC in a hot-line manner during the detection of the display panel, thereby to improve the production efficiency.

In a possible embodiment of the present disclosure, the switching transistor Q1 and the second switching transistor Q2 may each be a Metal-Oxide-Semiconductor (MOS) transistor.

Figure 8:
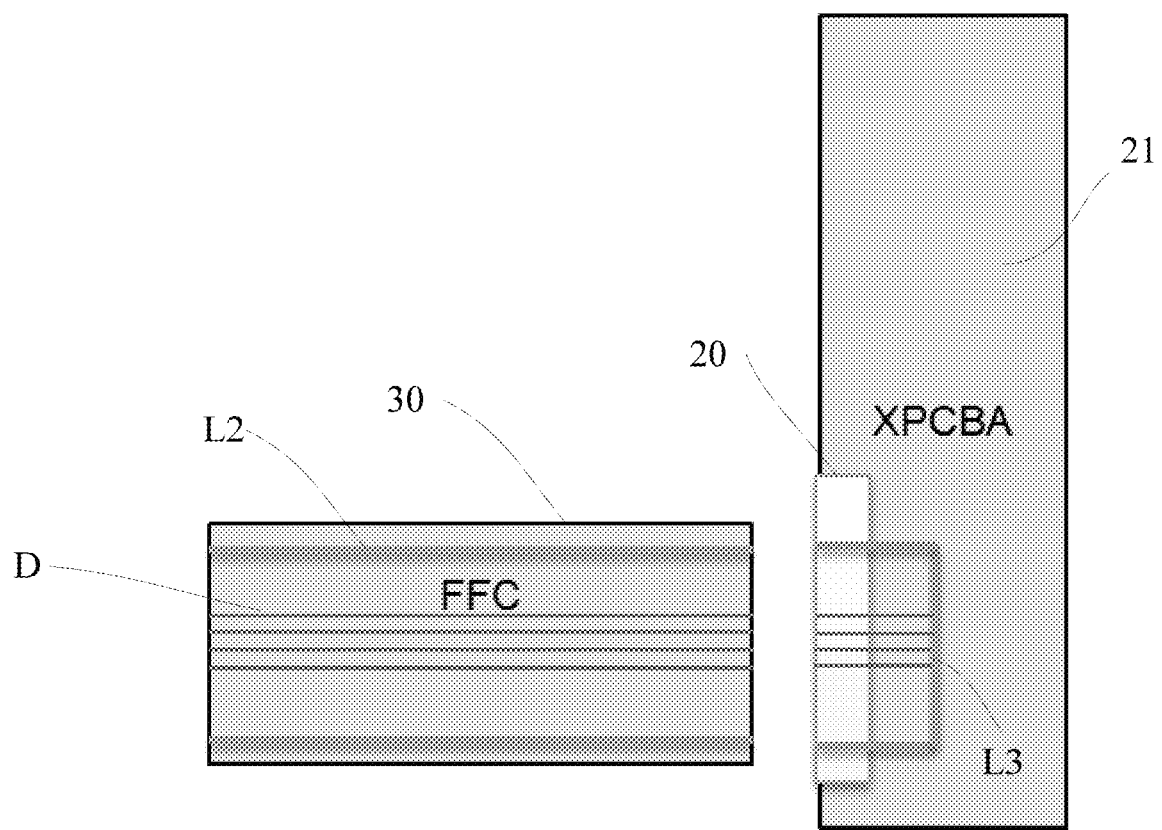
FIG. 8 is a schematic view showing a connector of the insertion and plugging protection device according to one embodiment of the present disclosure.

In a possible embodiment of the present disclosure, the at least one second substrate 21 may be connected to the display panel, and the power source module 201 may supply power to the display panel via the at least one second substrate 21. Further, as shown in FIG. 8, each connector 30 may include a plurality of data lines D. After the power source control circuit 50 is enabled so as to supply power, the data transmission may be performed by the first substrate 11 via the plurality of data lines D of the corresponding connector 30. To be specific, the data transmission may be performed between the first substrate 11 and the display panel connected to the corresponding second substrate 21.

In a possible embodiment of the present disclosure, positions of the two leads of the second lead pair L2 may be selected according to the practical need. As shown in FIG. 8, the two leads of the second lead pair L2 may be arranged at two sides of the connector 30 respectively, or arranged in the middle of the connector 30. It should be appreciated that, when the two leads are arranged at two sides of the connector 30 respectively, corresponding distal ends of the two leads may be aligned with each other, so as to ensure the middle portions of the two leads to be aligned with each other.

In a possible embodiment of the present disclosure, the first protection section of each protection sub-circuit 42 may include a plurality of first lead pairs, the second protection section of each protection sub-circuit 42 may include a plurality of second lead pairs, and the third protection section of each protection sub-circuit 42 may include a plurality of third lead pairs. Correspondingly, each protection sub-circuit 42 may include a plurality of processing sub-circuits 424. At this time, a connection mode among each first lead pair, the corresponding second lead pair, the corresponding third lead pair and the corresponding processing sub-circuit 424 may be substantially the same as that mentioned in FIGS. 2-7. In other words, the insertion and plugging device may be provided with a plurality of protection loops 41 mentioned in FIGS. 2-7.

It should be appreciated that, the quantity of the switching transistors may be set in accordance with the quantity of the preset electric signals outputted by the protection loop 41, and the plurality of switching transistors may be connected in series to each other between the second preset power source voltage signal line and the Enable end EN of the power source module 201. For example, when there are two protection loops 41 as shown in FIG. 3, the connector 30 may include two second lead pairs, i.e., four leads. The power source control circuit may include two switching transistors connected in series to each other and arranged between the second preset power source voltage signal V2 line and the Enable end EN of the power source module 201. When there are two protection loops 41 as shown in FIG. 5, the connector 30 may include two second lead pairs, i.e., four leads. The power source control circuit may include four switching transistors connected in series to each other and arranged between the second preset power source voltage signal line and the Enable end EN of the power source module 201.

According to the insertion and plugging protection device for the display device in the embodiments of the present disclosure, the protection circuit may form the protection loop through the at least one first interface assembly, the at least one second interface assembly and the at least one connector, and the protection circuit may generate the preset electric signal when the first end of each connector is connected to the corresponding first interface assembly and the second end of each connector is connected to the corresponding second interface assembly. The power source control circuit may control the power source module to output the first preset power source voltage signal in accordance with the preset electric signal. The power source module may output the first preset power source voltage signal only when each connector is connected to the first interface assembly and the second interface assembly normally. As a result, it is able to prevent the occurrence of a PIN connection disorder and a short circuit caused when the connector is inserted and plugged in a hot-line manner, and prevent the occurrence of an irreversible image abnormality for the display device (e.g., the display panel or T-Con) or prevent the display device from being burned out, thereby to improve the yield. In addition, it is able to facilitate the insertion and plugging of the FFC in a hot-line manner during the detection of the display panel, thereby to improve the production efficiency.

The present disclosure further provides in some embodiments a display device including the above-mentioned insertion and plugging protection device.

According to the display device in the embodiments of the present disclosure, through the insertion and plugging protection device, it is able to prevent the occurrence of a PIN connection disorder and a short circuit caused when the connector is inserted and plugged in a hot-line manner, and prevent the occurrence of an irreversible image abnormality for the display device (e.g., the display panel or T-Con) or prevent the display device from being burned out, thereby to improve the yield. In addition, it is able to facilitate the insertion and plugging of the FFC in a hot-line manner during the detection of the display panel, thereby to improve the production efficiency.

In the embodiments of the present disclosure, such words as "in the middle of", "longitudinal", "lateral", "length", "width", "thickness", "on/above", "under/below", "front", "back", "left", "right", "vertical", "horizontal", "top", "bottom", "inside", "outside", "clockwise", "counter-clockwise", "axial", "radial" and "circumferential" may be used to indicate directions or positions as viewed in the drawings, and they are merely used to facilitate the description in the present disclosure, rather than to indicate or imply that a device or member must be arranged or operated at a specific position.

In addition, such words as "first" and "second" are merely used to differentiate different components rather than to represent any order, number or importance, i.e., they are used to implicitly or explicitly indicate that there is at least one component. Further, such a phrase as "a plurality of" is used to indicate that there are at least two, e.g., two or three, components, unless otherwise specified.

Unless otherwise specified, such words as "arrange" and "connect" have a general meaning, e.g., the word "connect" may refer to fixed connection, removable connection or integral connection, or mechanical or electrical connection, or direct connection or indirect connection via an intermediate component, or communication between two components. The meanings of these words may be understood by a person skilled in the art in accordance with the practical need.

Unless otherwise defined, when one member is arranged on or under another member, the member may be in contact with the other member directly or via an intermediate member. In addition, when one member is arranged on/above another member, the member may be arranged right on/above the other member or not, or it merely means that the member is located at a level higher than the other member. When one member is arranged under/below another member, the member may be arranged right under/below the other member or not, or it merely means that the member is located at a level lower than the other member.

It should be further appreciated that, such phrases as "one embodiment" and "one of the embodiments" intend to indicate that the features, structures, materials or characteristics are contained in at least one embodiment of the present disclosure, rather than referring to a same embodiment. In addition, the features, structures, materials or characteristics may be combined in any embodiment or embodiments in an appropriate manner in the case of no conflict.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An insertion and plugging protection device for a display device, comprising:
at least one first interface assembly arranged on a first substrate;
at least one second interface assembly arranged on at least one second substrate;
at least one connector, a first end of each connector being adapted to a corresponding first interface assembly, and a second end of the connector being adapted to a corresponding second interface assembly;
a protection circuit forming a protection loop through the at least one first interface assembly, the at least one second interface assembly and the at least one connector, the protection loop being configured to generate a preset electric signal when the first end of the connector is connected to the corresponding first interface assembly and the second end of the connector is connected to the corresponding second interface assembly; and a power source control circuit connected to the protection circuit and a power source module of the display device, and configured to control the power source module to output a first preset power source voltage signal in accordance with the preset electric signal, wherein the protection circuit comprises at least one protection sub-circuit each comprising a first protection section arranged at the corresponding first interface assembly, a second protection section arranged at the corresponding connector, and a third protection section arranged at the corresponding second interface assembly, wherein the first protection section is adapted to the second protection section and electrically connected to the second protection section, and the second protection section is adapted to the third protection section and electrically connected to the third protection section, wherein the at least one protection sub-circuit is connected in series to each other, one end of the at least one protection sub-circuits connected in series to each other is connected to a second preset power source voltage signal line, and the other end of the at least one protection sub-circuits connected in series to each other is connected to the power source control circuit, wherein the first protection section comprises a first lead pair, one end of one lead of the first lead pair is connected to a second preset power source voltage signal line or a first protection section of a previous protection sub-circuit, and one end of the other lead of the first lead pair is connected to a first protection section of a next protection sub-circuit or the power source control circuit;

the second protection section comprises a second lead pair, one end of one lead of the second lead pair is connected to the other end of the one lead of the first lead pair, and one end of the other lead of the second lead pair is connected to the other end of the other lead of the first lead pair; and the third protection section comprises a third lead pair, one end of one lead of the third lead pair is connected to the other end of the one lead of the second lead pair, one end of the other lead of the third lead pair is connected to the other end of the other lead of the second lead pair, and the other end of the one lead of the third lead pair is connected to the other end of the other lead of the third lead pair.

2. The insertion and plugging protection device according to claim 1, wherein one end of one lead of a first lead pair of a first protection sub-circuit in the at least one protection sub-circuit serves as one end of the at least one protection sub-circuit connected in series to each other and is connected to the second preset power source voltage signal line;

one end of one lead of a first lead pair of each protection sub-circuit in the at least one protection sub-circuit other than the first protection sub-circuit is connected to one end of the other lead of the first lead pair of the previous protection sub-circuit;

one end of the other lead of a first lead pair of a last protection sub-circuit serves as the other end of the at least one protection sub-circuit connected in series to each other and is connected to the power source control circuit; and one end of the other lead of the first lead pair of each protection sub-circuit in the at least one protection sub-circuit other than the last protection sub-circuit is connected to one end of one lead of a first lead pair of the next protection sub-circuit.

3. The insertion and plugging protection device according to claim 1, wherein each protection sub-circuit further comprises a processing sub-circuit connected between the other end of the one lead of the third lead pair and the other end of the other lead of the third lead pair, and configured to process an electric signal from the one lead of the third lead pair and output the processed electric signal via the other lead of the third lead pair, the other lead of the second lead pair and the other lead of the first lead pair.

4. The insertion and plugging protection device according to claim 3, wherein the processing sub-circuit comprises:

a linear voltage regulator having a first pin, a second pin and a third pin, the first pin being connected to the other end of the one lead of the third lead pair via a first resistor, the third pin being connected to the other end of the other lead of the third lead pair;

a second resistor, one end of the second transistor is connected to the third pin; and a third resistor, one end of the third transistor is connected to the other end of the second resistor, and the other end of the third transistor is grounded, wherein the one end of the third resistor and the other end of the second resistor are connected to the second pin.

5. The insertion and plugging protection device according to claim 4, wherein the processing sub-circuit further comprises a first capacitor and a second capacitor connected in parallel to each other, one end of the first capacitor and the second capacitor connected in parallel to each other is connected to the first pin, and the other end of the first capacitor and the second capacitor connected in parallel to each other is grounded.

6. The insertion and plugging protection device according to claim 5, wherein the processing sub-circuit further comprises a third capacitor, a fourth capacitor and a voltage regulator transistor;

one end of the third capacitor is connected to the second pin, and the other end of the third capacitor is grounded;

one end of the fourth capacitor is connected to the third pin, and the other end of the fourth capacitor is grounded; and a cathode of the voltage regulator transistor is connected to the third pin, and an anode of the voltage regulator transistor is grounded.

7. The insertion and plugging protection device according to claim 1, wherein the power source control circuit comprises:

a fourth resistor, one end of the fourth transistor is connected to the second preset power source voltage signal line;

a fifth resistor, one end of the fifth transistor is connected to the other end of the fourth resistor, and the other end of the fifth transistor is grounded; and a switching transistor, a control end of the switching transistor is connected to the other end of the at least one protection sub-circuit connected in series to each other, a first end of the switching transistor is connected to the one end of the fifth resistor and the other end of the fourth resistor, and a second end of the switching transistor is connected to an Enable end of the power source module.

8. The insertion and plugging protection device according to claim 1, wherein one end of the at least one protection sub-circuit is connected to at least one preset power source, and the other end of the at least one protection sub-circuit is connected to at least one input end of the power source control circuit.

9. The insertion and plugging protection device according to claim 8, wherein each protection sub-circuit further comprises a processing sub-circuit connected between the other end of the one lead of the third lead pair and the other end of the other lead of the third lead pair, and configured to process an electric signal from the one lead of the third lead pair and output the processed electric signal through the other lead of the third lead pair, the other lead of the second lead pair and the other lead of the first lead pair.

10. The insertion and plugging protection device according to claim 9, wherein the at least one preset power source is connected to the protection loop, the processing sub-circuit of the at least one protection sub-circuit of the protection loop is configured to output at least one preset electric signal to the power source control circuit, and the power source control circuit is configured to control the power source module in accordance with the at least one preset electric signal so as to output a first preset power source voltage signal.

11. The insertion and plugging protection device according to claim 10, wherein the power source control circuit comprises a sixth resistor, a seventh resistor and at last one second switching transistor;
one end of the sixth resistor is connected to the second preset power source voltage signal line;
one end of the seventh resistor is connected to the other end of the sixth resistor, and the other end of the seventh resistor is grounded;
a control end of the at least one second switching transistor is connected to the other end of the at least one protection sub-circuit, respectively; and
the second switching transistors are connected in series to each other, one end of the second switching transistors connected in series to each other is connected to the one end of the seventh resistor and the other end of the sixth resistor, and the other end of the second switching transistors connected in series to each other is connected to the Enable end of the power source module.

12. The insertion and plugging protection device according to claim 1, wherein the connector is a Flexible Flat Cable (FFC).

13. A display device comprising the insertion and plugging protection device according to claim 1.

14. An insertion and plugging protection device for a display device, comprising:
at least one first interface assembly arranged on a first substrate;
at least one second interface assembly arranged on at least one second substrate;
at least one connector, a first end of each connector being adapted to a corresponding first interface assembly, and a second end of the connector being adapted to a corresponding second interface assembly;
a protection circuit forming a protection loop through the at least one first interface assembly, the at least one second interface assembly and the at least one connector, the protection loop being configured to generate a preset electric signal when the first end of the connector is connected to the corresponding first interface assembly and the second end of the connector is connected to the corresponding second interface assembly; and
a power source control circuit connected to the protection circuit and a power source module of the display device, and configured to control the power source module to output a first preset power source voltage signal in accordance with the preset electric signal,
wherein the protection circuit comprises at least one protection sub-circuit each comprising a first protection section arranged at the corresponding first interface assembly, a second protection section arranged at the corresponding connector, and a third protection section arranged at the corresponding second interface assembly, wherein the first protection section is adapted to the second protection section and electrically connected to the second protection section, and the second protection section is adapted to the third protection section and electrically connected to the third protection section,
wherein the at least one protection sub-circuit is connected in series to each other, one end of the at least one protection sub-circuits connected in series to each other is connected to a second preset power source voltage signal line, and the other end of the at least one protection sub-circuits connected in series to each other is connected to the power source control circuit,
wherein the power source control circuit comprises:
a fourth resistor, one end of the fourth transistor is connected to the second preset power source voltage signal line;
a fifth resistor, one end of the fifth transistor is connected to the other end of the fourth resistor, and the other end of the fifth transistor is grounded; and
a switching transistor, a control end of the switching transistor is connected to the other end of the at least one protection sub-circuit connected in series to each other, a first end of the switching transistor is connected to the one end of the fifth resistor and the other end of the fourth resistor, and a second end of the switching transistor is connected to an Enable end of the power source module.

15. An insertion and plugging protection device for a display device, comprising:
at least one first interface assembly arranged on a first substrate;
at least one second interface assembly arranged on at least one second substrate;
at least one connector, a first end of each connector being adapted to a corresponding first interface assembly, and a second end of the connector being adapted to a corresponding second interface assembly;
a protection circuit forming a protection loop through the at least one first interface assembly, the at least one second interface assembly and the at least one connector, the protection loop being configured to generate a preset electric signal when the first end of the connector is connected to the corresponding first interface assembly and the second end of the connector is connected to the corresponding second interface assembly; and
a power source control circuit connected to the protection circuit and a power source module of the display device, and configured to control the power source module to output a first preset power source voltage signal in accordance with the preset electric signal,
wherein the protection circuit comprises at least one protection sub-circuit each comprising a first protection section arranged at the corresponding first interface assembly, a second protection section arranged at the corresponding connector, and a third protection section arranged at the corresponding second interface assembly, wherein the first protection section is adapted to the second protection section and electrically connected to the second protection section, and the second protection section is adapted to the third protection section and electrically connected to the third protection section, wherein one end of the at least one protection sub-circuit is connected to at least one preset power source, and the other end of the at least one protection sub-circuit is connected to at least one input end of the power source control circuit, wherein each protection sub-circuit further comprises a processing sub-circuit connected between the other end of the one lead of the third lead pair and the other end of the other lead of the third lead pair, and configured to process an electric signal from the one lead of the third lead pair and output the processed electric signal through the other lead of the third lead pair, the other lead of the second lead pair and the other lead of the first lead pair.

* * * * *